United States Patent
Yahagi et al.

(10) Patent No.: US 10,214,830 B2
(45) Date of Patent: Feb. 26, 2019

(54) SUBSTRATE HOLDER AND PLATING APPARATUS

(71) Applicant: EBARA CORPORATION, Tokyo (JP)

(72) Inventors: Mitsutoshi Yahagi, Tokyo (JP); Masaaki Kimura, Tokyo (JP); Yusuke Tamari, Sacramento, CA (US)

(73) Assignee: EBARA CORPORATION, Tokyo (JP)

(*) Notice: Subject to any disclaimer, the term of this patent is extended or adjusted under 35 U.S.C. 154(b) by 150 days.

(21) Appl. No.: 14/882,671

(22) Filed: Oct. 14, 2015

(65) Prior Publication Data
US 2016/0108539 A1    Apr. 21, 2016

Related U.S. Application Data

(60) Provisional application No. 62/064,980, filed on Oct. 16, 2014.

(51) Int. Cl.
| | |
|---|---|
| *C25D 17/00* | (2006.01) |
| *H01L 21/687* | (2006.01) |
| *C25D 17/06* | (2006.01) |
| *H01L 21/67* | (2006.01) |
| *C25D 7/12* | (2006.01) |

(52) U.S. Cl.
CPC ......... *C25D 17/004* (2013.01); *C25D 17/001* (2013.01); *C25D 17/06* (2013.01); *H01L 21/67126* (2013.01); *H01L 21/68721* (2013.01); *H01L 21/68728* (2013.01); *C25D 7/12* (2013.01)

(58) Field of Classification Search
CPC ......... C25D 7/12–7/126; C25D 17/001; C25D 17/06; H01L 21/67–21/6838; H01L 21/68721
See application file for complete search history.

(56) References Cited

U.S. PATENT DOCUMENTS

| | | | | |
|---|---|---|---|---|
| 6,159,354 A | * | 12/2000 | Contolini | C25D 17/001 205/137 |
| 6,193,859 B1 | | 2/2001 | Contolini et al. | |
| 6,645,356 B1 | * | 11/2003 | Woodruff | C25D 17/001 204/224 R |
| 7,985,325 B2 | * | 7/2011 | Rash | C25D 17/02 204/242 |

(Continued)

FOREIGN PATENT DOCUMENTS

| | | |
|---|---|---|
| CN | 1316023 A | 10/2001 |
| CN | 102623324 A | 8/2012 |

(Continued)

*Primary Examiner* — Alexander W Keeling
(74) *Attorney, Agent, or Firm* — Baker & Hostetler LLP

(57) ABSTRACT

A substrate holder for holding a substrate, such as a wafer, is disclosed. The substrate holder includes a seal ring which can be brought into contact with a peripheral portion of the substrate, a support ring supporting the seal ring, and a fixing ring pressing the seal ring against the support ring. The fixing ring includes an annular portion having an inner circumferential surface and an outer circumferential surface, each of which is constituted by a tapered surface. The fixing ring further includes a seal-ring pressing portion connected to the annular portion, and a regulation ring projecting radially inwardly from the seal-ring pressing portion. The regulation ring has an inside diameter which is smaller than an inside diameter of the seal ring.

28 Claims, 18 Drawing Sheets

(56) References Cited

U.S. PATENT DOCUMENTS

| | | | | |
|---|---|---|---|---|
| 2003/0010641 | A1* | 1/2003 | Kholodenko | C25D 7/12 |
| | | | | 205/80 |
| 2007/0202686 | A1* | 8/2007 | Dixit | C25D 7/04 |
| | | | | 438/625 |
| 2012/0043200 | A1* | 2/2012 | Fujikata | C25D 17/06 |
| | | | | 204/242 |
| 2012/0184098 | A1* | 7/2012 | Hamm | C25D 5/12 |
| | | | | 438/654 |
| 2014/0183049 | A1* | 7/2014 | Mayer | C25D 17/002 |
| | | | | 205/133 |

FOREIGN PATENT DOCUMENTS

| | | | | |
|---|---|---|---|---|
| CN | 103874790 | A | 6/2014 | |
| JP | 05-222590 | A | 8/1993 | |
| JP | 11-193499 | A | 7/1999 | |
| JP | 2002-294495 | A | 10/2002 | |
| JP | 2012-062570 | A | 3/2012 | |
| WO | WO 2000/003072 | A1 | 1/2000 | |
| WO | WO-0003072 | A1 * | 1/2000 | H01L 21/2885 |

\* cited by examiner

SUBSTRATE HOLDER AND PLATING APPARATUS

CROSS REFERENCE TO RELATED APPLICATION

This document claims priority to U.S. Provisional Patent Application No. 62/064,980 filed Oct. 16, 2014, the entire contents of which are hereby incorporated by reference.

BACKGROUND

A plating apparatus is a device for depositing a conductive material on a surface of a wafer by passing an electric current between an anode and the wafer which are immersed in a plating solution. During plating of the wafer, the wafer is held by a substrate holder, and the wafer, together with the substrate holder, is immersed in the plating solution. The wafer is coupled to a power source via the substrate holder, while the anode is coupled to the power source via an anode holder. The substrate holder has a plurality of electric contacts which are brought into contact with a peripheral portion of the wafer, so that the wafer and the substrate holder are electrically connected through these electric contacts. When a voltage is applied between the wafer and the anode, an electric current flows from the anode through the plating solution to the wafer, thereby causing a deposition of a conductive material on the surface of the wafer.

In order to uniformly deposit the conductive material on the wafer surface, it is necessary to appropriately control an electric field which is formed between the wafer and the anode. From this viewpoint, a regulation plate (or an electric-field shielding plate) is provided between the wafer and the anode. This regulation plate has a circular hole whose diameter is smaller than a diameter of the wafer, and regulates the electric field by allowing the electric current, flowing from the anode to the wafer, to pass only through the circular hole.

However, even if such regulation plate is provided, a larger amount of conductive material is deposited on the peripheral portion of the wafer, compared with other portion of the wafer. This is because the electric contacts of the substrate holder are arranged so as to touch the peripheral portion of the wafer. Such a non-uniform deposition of the conductive material may decrease yield of device products. Therefore, there is a demand for a technique that can uniformly deposit a conductive material on a surface of a wafer.

In addition, there is also a demand for an improved substrate holder which does not cause a contamination of a wafer. The substrate holder has a base member and a holding member which are configured to sandwich a wafer between them. The substrate holder includes a locking mechanism that locks the holding member to the base member and unlocks the holding member from the base member, so that the substrate holder can detachably hold the wafer. However, the locking mechanism necessarily has sliding parts, and therefore contact surfaces of these sliding parts may generate particles. When the substrate holder is pulled out of a plating solution after plating of the wafer, the plating solution containing the particles flows downwardly from the substrate holder onto a plated surface of the wafer, thus possibly contaminating the wafer.

Moreover, the substrate holder generally includes a component made of corrosion-resistant metal, such as titanium, which is highly resistant against a plating solution. The component made of such a metal may generate a by-product as a result of a reaction with the plating solution. When the substrate holder is pulled out of the plating solution after plating of the wafer, the plating solution containing the by-product flows downwardly from the substrate holder onto a plated surface of the wafer, thus possibly contaminating the wafer. Thus, there has been a demand for an improved substrate holder capable of preventing such a contamination of the plated surface of the wafer.

SUMMARY OF THE INVENTION

According to an embodiment, there is provided a substrate holder capable of achieving a uniform deposition of a conductive material on an entirety of a surface of a substrate, such as a wafer, and capable of preventing a contamination of a plated surface of the substrate due to foreign matters, such as particles or a by-product, contained in a plating solution.

Embodiments, which will be described below, relate to a substrate holder for use in a plating apparatus for plating a surface of a substrate, such as a wafer, and also relate to a plating apparatus having such a substrate holder.

In an embodiment, there is provided a substrate holder comprising: a seal ring which can be brought into contact with a peripheral portion of a substrate; a support ring supporting the seal ring; and a fixing ring pressing the seal ring against the support ring. The fixing ring includes an annular portion having an inner circumferential surface and an outer circumferential surface, each of which is constituted by a tapered surface. The fixing ring further includes a seal-ring pressing portion connected to the annular portion, and a regulation ring projecting radially inwardly from the seal-ring pressing portion. The regulation ring has an inside diameter which is smaller than an inside diameter of the seal ring.

In an embodiment, there is provided a plating apparatus comprising: a plating bath capable of holding a plating solution therein; a substrate holder configured to be able to hold a substrate; an anode disposed in the plating bath; and a power source capable of applying a voltage between the anode and the substrate held by the substrate holder. The substrate holder includes a seal ring which can be brought into contact with a peripheral portion of the substrate, a support ring supporting the seal ring, and a fixing ring pressing the seal ring against the support ring. The fixing ring includes an annular portion having an inner circumferential surface and an outer circumferential surface, each of which is constituted by a tapered surface. The fixing ring further includes a seal-ring pressing portion connected to the annular portion, and a regulation ring projecting radially inwardly from the seal-ring pressing portion. The regulation ring has an inside diameter which is smaller than an inside diameter of the seal ring.

According the above-described embodiments, the regulation ring can regulate an electric field on a peripheral portion of a substrate, and can therefore decrease an amount of conductive material deposited on the peripheral portion of the substrate. As a result, a uniform deposition of the conductive material over an entirety of a surface of the substrate can be achieved.

DESCRIPTION OF EMBODIMENTS

Figure 1:
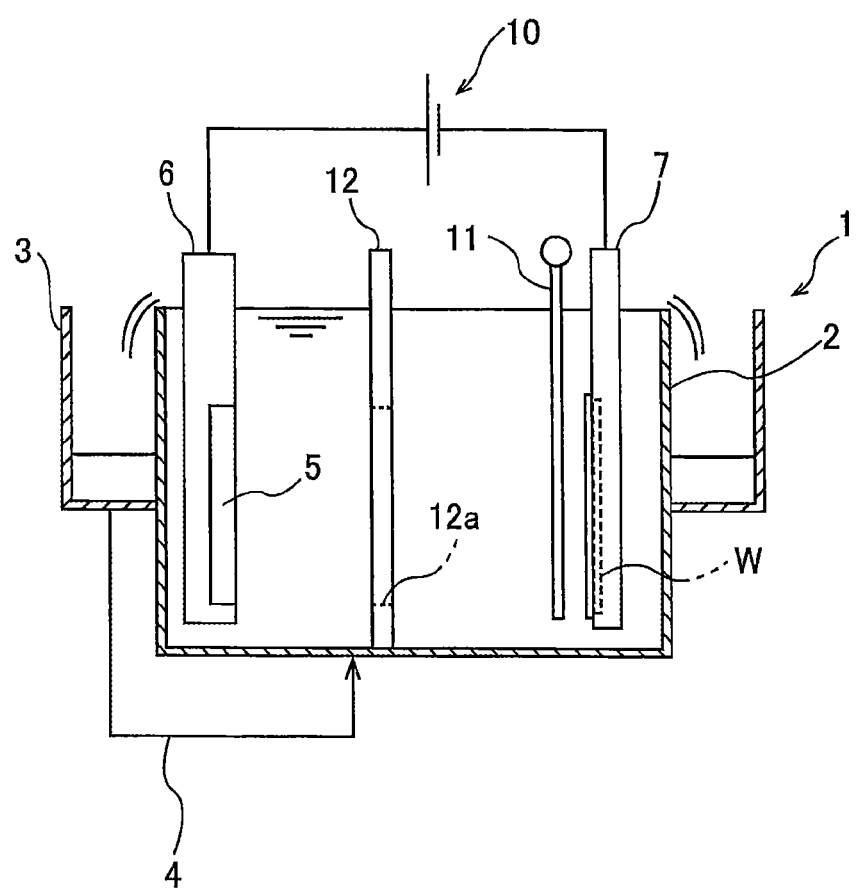
FIG. 1 is a schematic view showing an embodiment of a plating apparatus.
Figure 2:
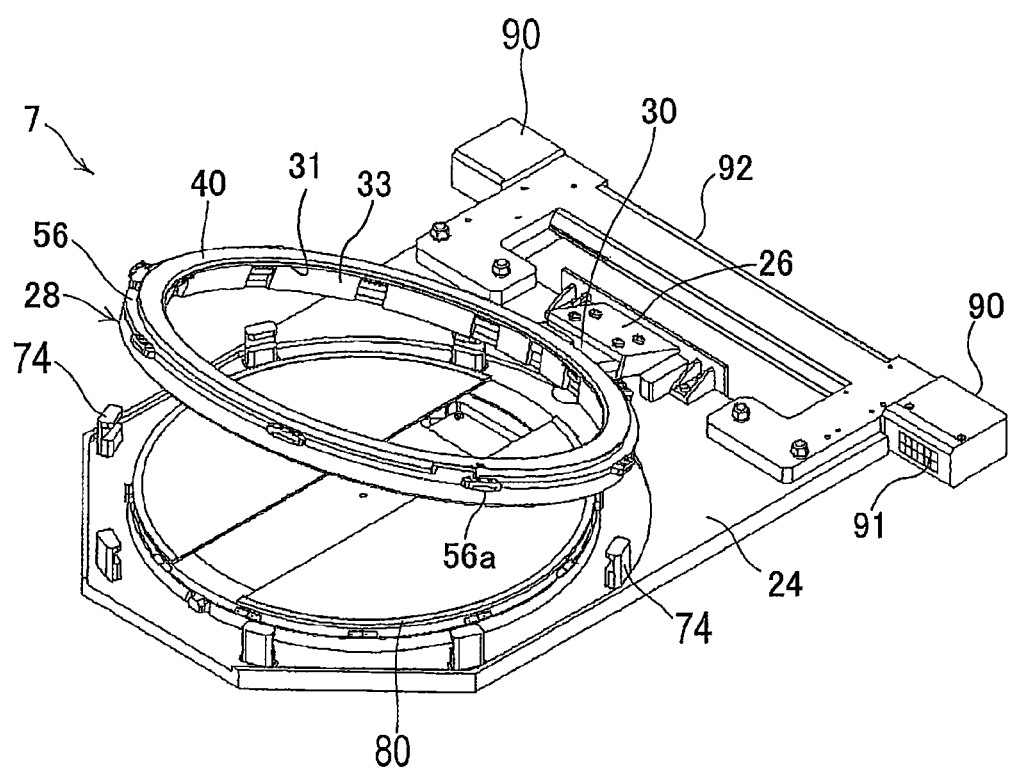
FIG. 2 is a perspective view showing a substrate holder.

Embodiments will be described below with reference to the drawings. In FIGS. 1 through 23, the same or corresponding elements are denoted by the same reference numerals, and their repetitive descriptions will be omitted.

FIG. 1 is a schematic view of an embodiment of a plating apparatus. The plating apparatus includes a plating bath 1 for holding a plating solution therein. The plating bath 1 includes a storage bath 2 in which the plating solution can be stored, and an overflow bath 3 adjacent to the storage bath 2. One end of a plating-solution circulation line 4 for circulating the plating solution is coupled to a bottom of the overflow bath 3, and the other end of the plating-solution circulation line 4 is coupled to a bottom of the storage bath 2. The plating solution is allowed to overflow a side wall of the storage bath 2 into the overflow bath 3, and is returned to the storage bath 2 through the plating-solution circulation line 4.

The plating apparatus further includes an anode 5 formed from a metal, an anode holder 6 holding the anode 5 and immersing the anode 5 in the plating solution retained in the storage bath 2, and a substrate holder 7 capable of detachably holding a wafer W, which is an example of a substrate, and immersing the wafer W in the plating solution retained in the storage bath 2. The anode 5 and the substrate holder 7 are disposed in a vertical position so that the anode 5 and the wafer W opposite each other in the plating solution.

The anode 5 is coupled to a positive electrode of a power source 10 via the anode holder 6, while the wafer W is coupled to a negative electrode of the power source 10 via the substrate holder 7. When a voltage is applied between the anode 5 and the wafer W by the power source 10, an electric current flows from the anode 5 to the wafer W through the plating solution, whereby a conductive material (e.g., a metal) is deposited on the surface of the wafer W.

The plating apparatus further includes an agitation paddle 11 for agitating the plating solution, and a regulation plate 12 for regulating an electric field formed between the anode 5 and the wafer W. The regulation plate 12 is disposed in the vertical position and has an opening 12a in a circular shape that allows the electric current to pass therethrough in the plating solution. The agitation paddle 11 is disposed in proximity to the surface of the wafer W held by the substrate holder 7. The regulation plate 12 is located between the agitation paddle 11 and the anode 5, and the agitation paddle 11 is located between the wafer W and the regulation plate 12. The agitation paddle 11 is disposed in the vertical position and is configured to reciprocate parallel to the wafer W to agitate the plating solution so that a sufficient amount of metal ions can be supplied uniformly to the surface of the wafer W during plating of the wafer W.

As shown in FIGS. 2 through 5, the substrate holder 7 includes a base member 24 having a rectangular plate shape and a holding member 28 rotatably coupled to the base member 24 through a hinge 26. The substrate holder 7 is configured to hold the wafer W by sandwiching it between the base member 24 and the holding member 28. In another embodiment, the holding member 28 may be disposed so as to opposite the base member 24 and may move toward and away from the base member 24 so that the holding member 28 is closed and opened.

The holding member 28 has a seal ring (or a first seal ring) 31 which can be brought into contact with a peripheral portion of the wafer W, a support ring 33 which supports the seal ring 31, and a fixing ring (or a first fixing ring) 40 pressing the seal ring 31 against the support ring 33. The seal ring 31 is configured to press against the peripheral portion of the wafer W to seal a gap between the holding member 28 and the wafer W.

Figure 5:
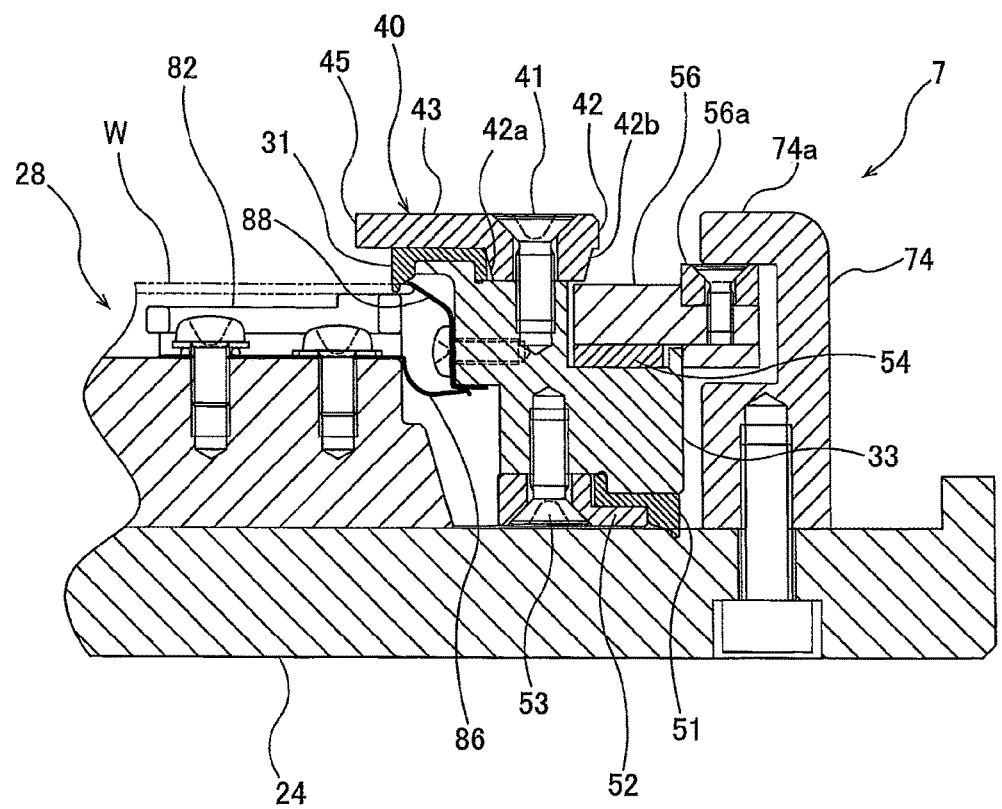
FIG. 5 is an enlarged view showing a part of the substrate holder shown in FIG. 4.

As shown in FIG. 5, the fixing ring 40 is secured to the support ring 33 by screws 41. The screws 41 extend through the fixing ring 40 into threaded holes formed in the support ring 33. By fastening the screws 41, the seal ring 31 is held between the fixing ring 40 and the support ring 33.

The fixing ring 40 includes an annular portion 42 having an inner circumferential surface 42a and an outer circumferential surface 42b, each of which is constituted by a tapered surface. The fixing ring 40 further includes an annular seal-ring pressing portion 43 connected to the annular portion 42, and a regulation ring 45 protruding radially inwardly from the seal-ring pressing portion 43. The annular portion 42, the seal-ring pressing portion 43, and the regulation ring 45, which constitute the fixing ring 40, are integrally formed from the same material. The seal ring 31 is pressed against the support ring 33 by the seal-ring pressing portion 43. The regulation ring 45 has an inside diameter which is smaller than an inside diameter of the seal ring 31.

The holding member 28 further includes a seal ring (or a second seal ring) 51 facing the base member 24. This seal ring 51 is pressed against the support ring 33 by a fixing ring (or a second fixing ring) 52, which is secured to the support ring 33 by screws 53. The seal ring 51 is configured to press against the base member 24 to seal a gap between the base member 24 and the holding member 28. The seal rings 31, 51 are formed from elastic material.

A spacer ring 54 and a retaining ring 56 are rotatably mounted to the support ring 33. The spacer ring 54 is rotatable relative to the support ring 33 and the retaining ring 56. The retaining ring 56 is rotatable relative to the spacer ring 54 and the support ring 33. The retaining ring 56 is made of a material having high rigidity and excellent acid and alkali corrosion resistance. For example, the retaining ring 56 is made of titanium. The spacer ring 54 is made of a material having a low friction coefficient, for example PTFE, so that the retaining ring 56 can rotate smoothly.

A plurality of dampers 74, located outside the retaining ring 56, are arranged at equal intervals along a circumferential direction of the retaining ring 56. These dampers 74 are secured to the base member 24. Each of the clampers 74 has an inverted L-shape and has a protrusion 74a projecting inwardly. The retaining ring 56 has protrusions 56a projecting outwardly. The protrusions 56a of the retaining ring 56 are arranged so as to be able to engage with the protrusions 74a of the dampers 74. A plurality of (e.g., three) upwardly projecting portions 56a (see FIG. 3) are provided on the retaining ring 56 at locations along the circumferential direction of the retaining ring 56. The retaining ring 56 can be rotated by pushing and moving each projecting portion 56a in a lateral direction by means of a rotating pin (not shown).

An operation of the substrate holder 7 when holding the wafer W is performed as follows. With the holding member 28 open, the wafer W is inserted into the central portion of the base member 24. The holding member 28 is then closed through the hinge 26. Subsequently the retaining ring 56 is rotated clockwise until the protrusions 56a of the retaining ring 56 engage with the protrusions 74a of the dampers 74. As a result, the base member 24 and the holding member 28 are fastened to each other and locked. The holding member 28 can be unlocked by rotating the retaining ring 56 counterclockwise until the protrusions 56a of the retaining ring 56 are disengaged from the protrusions 74a of the dampers 74. The dampers 74 and the retaining ring 56 constitute a locking mechanism for locking the holding member 28 to the base member 24.

When the holding member 28 is locked, the seal ring 31 is placed in pressure contact with the peripheral portion of the wafer W. The seal ring 31 is pressed uniformly against the wafer W to thereby seal the gap between the peripheral portion of the wafer W and the holding member 28. Similarly, when the holding member 28 is locked, the seal ring 51 is placed in pressure contact with a surface of the base member 24. The seal ring 51 is pressed uniformly against the base member 24 to thereby seal the gap between the base member 24 and the holding member 28.

Figure 3:
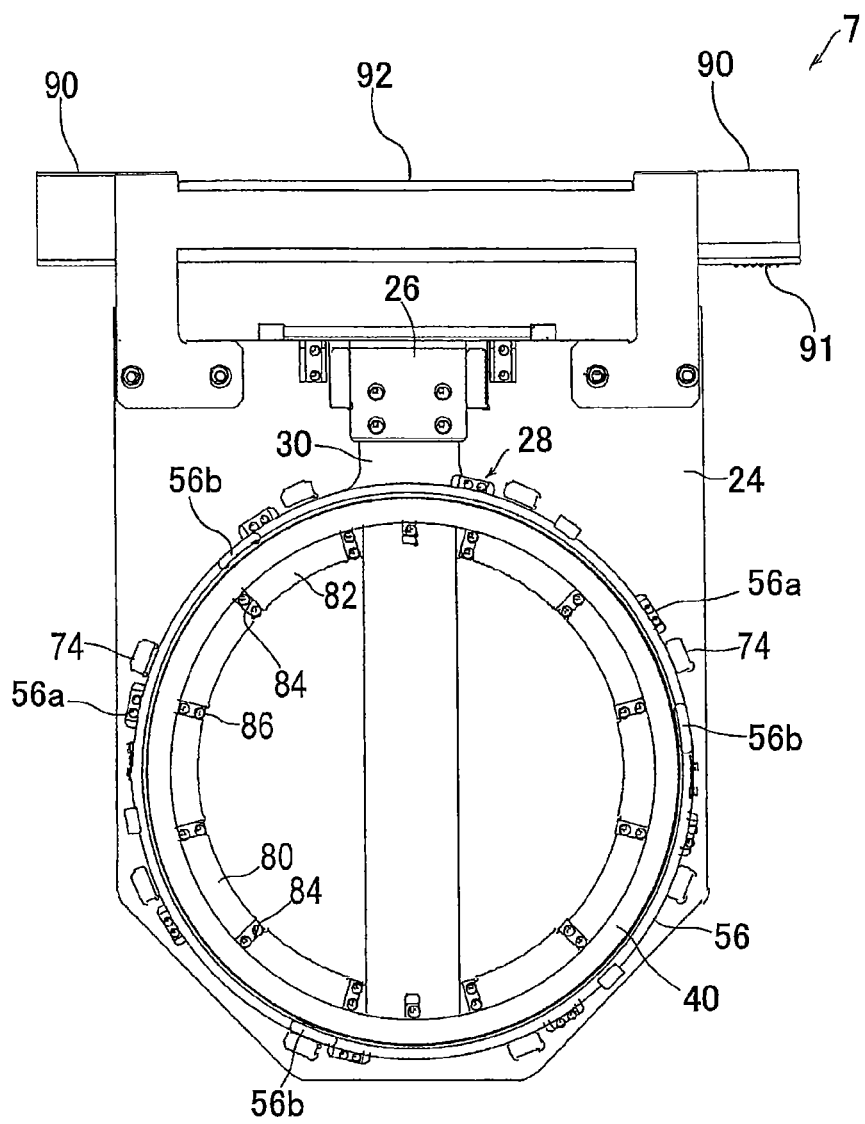
FIG. 3 is a plan view of the substrate holder shown in FIG. 2.
Figure 4:
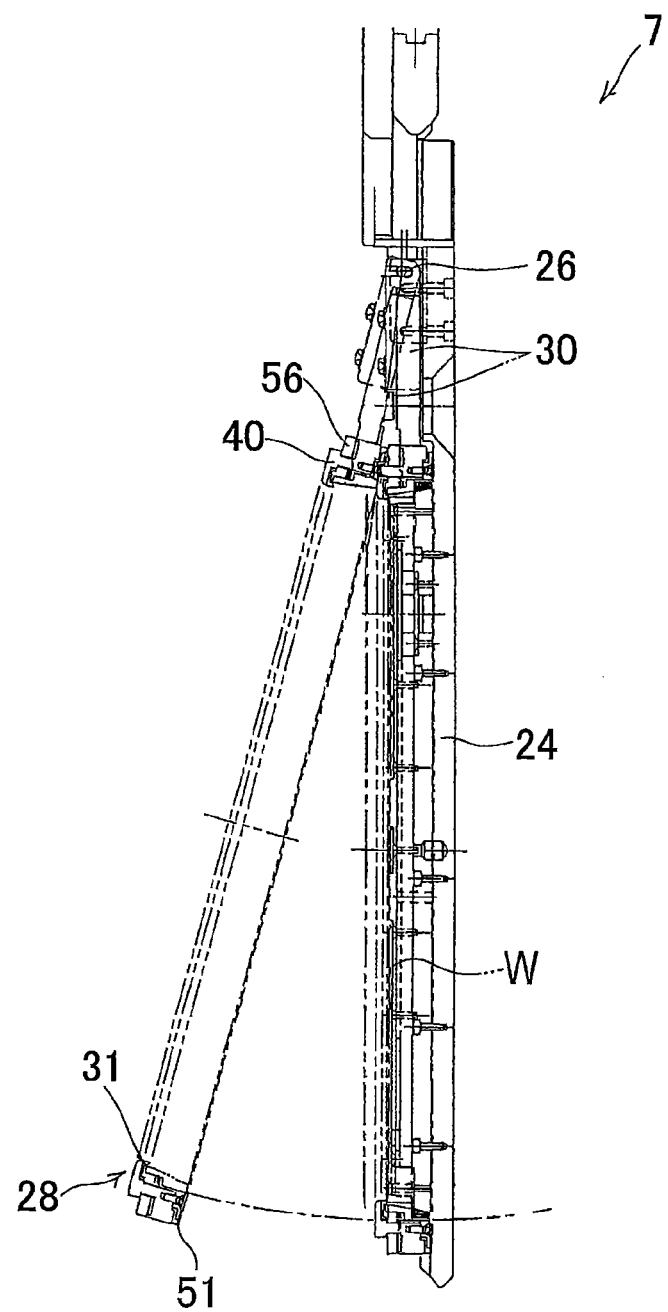
FIG. 4 is a side view of the substrate holder shown in FIG. 2.

As shown in FIG. 3, a pair of holder hangers 90, each extending outwardly, are provided on an end portion of the base member 24. A hand lever 92 extends between the holder hangers 90 on both sides. In the plating apparatus shown in FIG. 1, the holder hungers 90 are placed onto surrounding walls of the storage bath 2 of the plating bath 1, so that the substrate holder 7 is suspended into the storage bath 2.

A substrate-holder transporter (not shown in the drawings) is configured to move the substrate holder 7 while holding the hand lever 92 of the substrate holder 7. More specifically, the substrate-holder transporter transports the substrate holder 7, holding the wafer W to be plated, to the plating bath 1, immerses the substrate holder 7, which is in the vertical position, in the plating solution held in the plating bath 1, pulls the substrate holder 7, which is in the vertical position, out of the plating solution after plating of the wafer W, and transports the substrate holder 7, holding the plated wafer W, to another processing bath (e.g., a cleaning bath).

As shown in FIG. 3, a protruding portion 82, which is in a ring shape corresponding to a size of the wafer W, is formed on the surface of the base member 24. This protruding portion 82 has an annular support surface 80 which comes in contact with the peripheral portion of the wafer W to support the wafer W. The protruding portion 82 has recesses 84 located at predetermined positions along a circumferential direction of the protruding portion 82.

A plurality of (e.g., twelve as illustrated) conductive members 86 are disposed in the recesses 84, respectively. These conductive members 86 are connected respectively to wires extending from a feeder terminal 91 provided on the holder hanger 90. As shown in FIG. 5, when the wafer W is held by the substrate holder 7, ends of the conductive members 86 elastically touch electric contacts 88 which are secured to the support ring 33.

The electric contacts 88, which can be electrically connected to the conductive members 86, are each in a form of leaf spring. The electric contacts 88 are located outside the seal ring 31. The electric contacts 88 are configured to be able to bend easily due to its elasticity. When the wafer W is held between the base member 24 and the holding member 28, distal ends of the electric contacts 88 are placed in elastic contact with the peripheral portion of the wafer W supported on the support surface 80 of the base member 24.

When the first seal ring 31 is pressed against the peripheral portion of the wafer W and the second seal ring 51 is pressed against the base member 24, a hermetically-enclosed space is formed along the peripheral portion of the wafer W. The electric contacts 88 and the conductive members 86 are located in this hermetically-enclosed space. Therefore, while the substrate holder 7 is immersed in the plating solution, the plating solution does not contact the electric contacts 88 and the conductive members 86.

Figure 6:
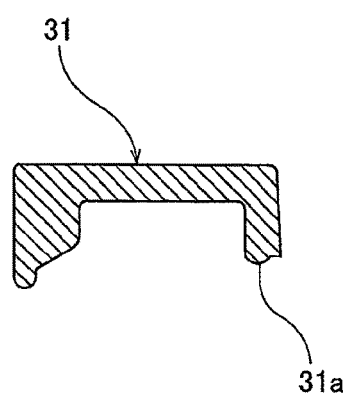
FIG. 6 is a cross-sectional view of a seal ring.

FIG. 6 is a cross-sectional view of the seal ring 31. As shown in FIG. 6, the seal ring 31 has an annular protrusion 31a at its outer lower end. This annular protrusion 31a is constituted as a part of the seal ring 31, and is formed from an elastic material. When the screws 41 shown in FIG. 5 are fastened, the annular protrusion 31a of the seal ring 31 is pressed against the support ring 33 by the fixing ring 40. As a result, a gap between the seal ring 31 and the support ring 33 is completely sealed.

Referring back to FIG. 5, the fixing ring 40 has the regulation ring 45 which is located more inwardly than the seal ring 31. The inside diameter of the regulation ring 45 is smaller than the diameter of the wafer W and is smaller than a diameter of the circular opening 12a of the regulation plate 12 shown in FIG. 1. The regulation ring 45 is located radially inwardly of an inner circumferential edge of the seal ring 31, and disposed so as to be able to cover the peripheral portion of the wafer W.

As well as the regulation plate 12, the regulation ring 45 has a function to regulate the electric field formed between the anode 5 and the wafer W. In particular, the regulation ring 45 can regulate the electric field formed on the peripheral portion of the wafer W. Therefore, an amount of conductive material deposited on the peripheral portion of the wafer W can be suppressed, and as a result, a uniform deposition of the conductive material over the entirety of the surface of the wafer W can be achieved.

As discussed above, since the holding member 28 is locked by the engagement between the protrusions 56a of the retaining ring 56 and the protrusions 74a of the dampers 74, wear particles may be produced as a result of the sliding contact between the protrusions 56a and the protrusions 74a. As can be seen from FIG. 1, the substrate holder 7, holding the wafer W, is immersed in the plating solution while the substrate holder 7 is kept in the vertical position, and is pulled out of the plating solution while the substrate holder 7 is kept in the vertical position as well. When the substrate holder 7 is pulled out of the plating solution, the wear particles, together with the plating solution, flow downwardly on the substrate holder 7 and may be attached to a plated surface of the wafer W, thus possibly causing a contamination of the wafer W.

Thus, the fixing ring 40 according to the embodiment is shaped so as to be able to foil a flow of the plating solution avoiding the surface of the wafer W when the substrate holder 7 is pulled out of the plating solution. More specifically, the fixing ring 40 includes the annular portion 42 having the outer circumferential surface 42b which is constituted by a tapered surface. This outer circumferential surface (tapered surface) 42b is inclined downwardly toward an inside of the substrate holder 7 when the substrate holder 7 is in the vertical position.

Figure 7:
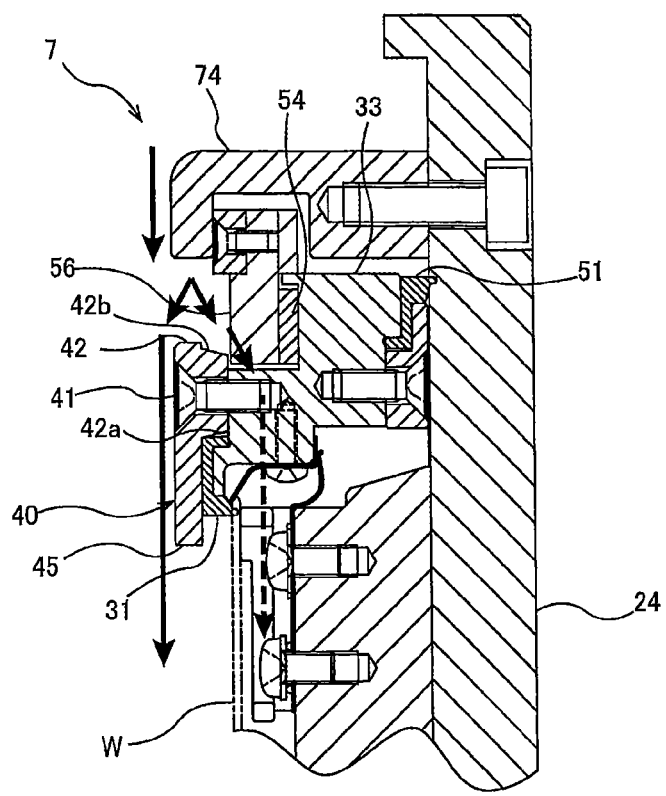
FIG. 7 is a diagram illustrating a flow of a plating solution on the substrate holder when the substrate holder in a vertical position is pulled out of the plating solution.

FIG. 7 is a diagram illustrating the flow of the plating solution on the substrate holder 7 according to the above-described embodiment when the substrate holder 7 is pulled out of the plating solution. As shown in FIG. 7, when the substrate holder 7 in the vertical position is pulled out of the plating solution, the plating solution is brought into contact with the tapered surface, i.e., the outer circumferential surface 42b, of the fixing ring 40 and is divided into two flows. One of the two flows moves downwardly on an outside surface of the fixing ring 40. The regulation ring 45, which constitutes an inner circumferential edge of the fixing ring 40, can prevent this downward flow of the plating solution from advancing toward the wafer W. The other of the two flows is directed toward the inside of the substrate holder 7 by the outer circumferential surface 42b constituted by the tapered surface, and advances downwardly on the outer circumferential surface 42b of the fixing ring 40 and an outer circumferential surface of the support ring 33 without touching the wafer W. In this manner, the regulation ring 45 and the outer circumferential surface (tapered surface) 42b of the fixing ring 40 can reduce an amount of the plating solution that is brought into contact with the plated surface of the wafer W when the substrate holder 7 is pulled out of the plating solution. In particular, the outer circumferential surface (tapered surface) 42b of the fixing ring 40 can form the flow of the plating solution that moves away from the wafer W.

Figure 8:
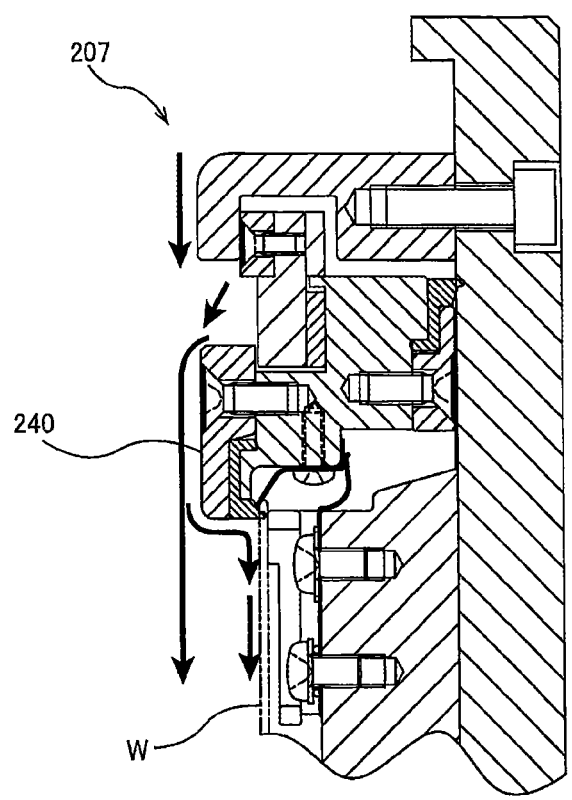
FIG. 8 is a diagram illustrating a flow of a plating solution on a conventional substrate holder when the conventional substrate holder in a vertical position is pulled out of the plating solution.

FIG. 8 is a diagram illustrating a flow of a plating solution on a conventional substrate holder 207 when the conventional substrate holder 207 is pulled out of the plating solution. As shown in FIG. 8, when the conventional substrate holder 207, which is in a vertical position, is pulled out of the plating solution, the plating solution is brought into contact with an outer circumferential surface of a seal ring 240 to flow outwardly, and further flows downwardly on an outside surface of the seal ring 240. The plating solution is divided below the seal ring 240 into two flows, one of which moves on a wafer W. As a result, foreign matters, such as wear particles, contained in the plating solution may be attached to a plated surface of the wafer W.

As can be seen from a comparison between the substrate holder 7 according to the embodiment shown in FIG. 7 and the conventional substrate holder 207 shown in FIG. 8, the outer circumferential surface 42b, which is constituted by a tapered surface, can reduce an amount of the plating solution flowing toward the surface of the wafer W when the substrate holder 7 is pulled out of the plating solution. Moreover, the regulation ring 45 can prevent the plating solution from flowing toward the surface of the wafer W. Therefore, the substrate holder 7 according to the embodiment can significantly reduce an amount of the plating solution flowing on the plated surface of the wafer W.

Figure 9:
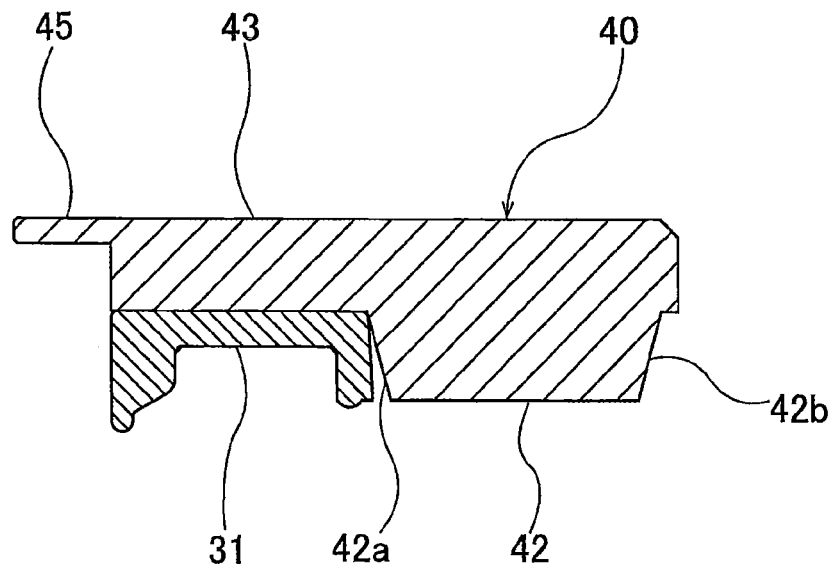
FIG. 9 is a view showing a regulation ring having a thickness which is different from a thickness of a seal-ring pressing portion.
Figure 10:
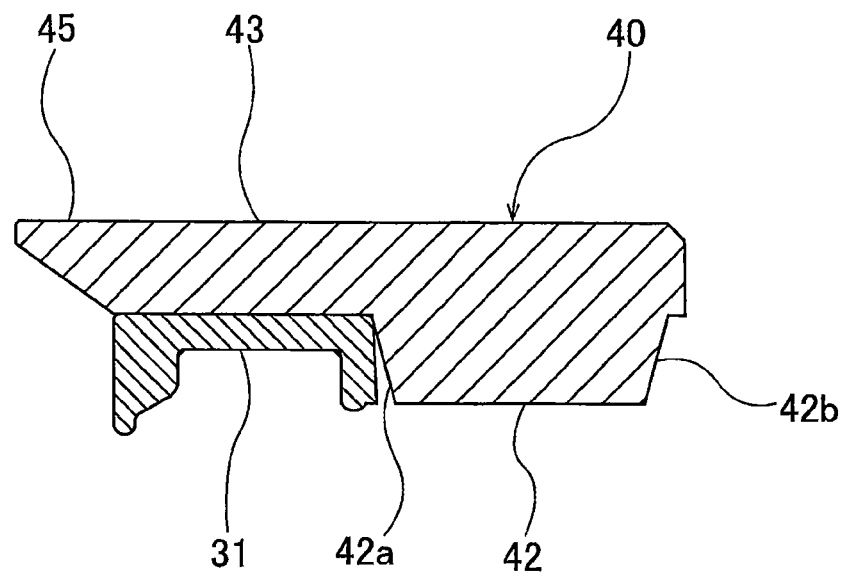
FIG. 10 is a view of a regulation ring having an inclined inner circumferential surface.

As shown in FIG. 9, the regulation ring 45 may have a thickness which is different from a thickness of the seal-ring pressing portion 43. Further, as shown in FIG. 10, the regulation ring 45 may have an inclined inner circumferential surface. The regulation rings having these shapes can also achieve the same result as well.

Figure 11:
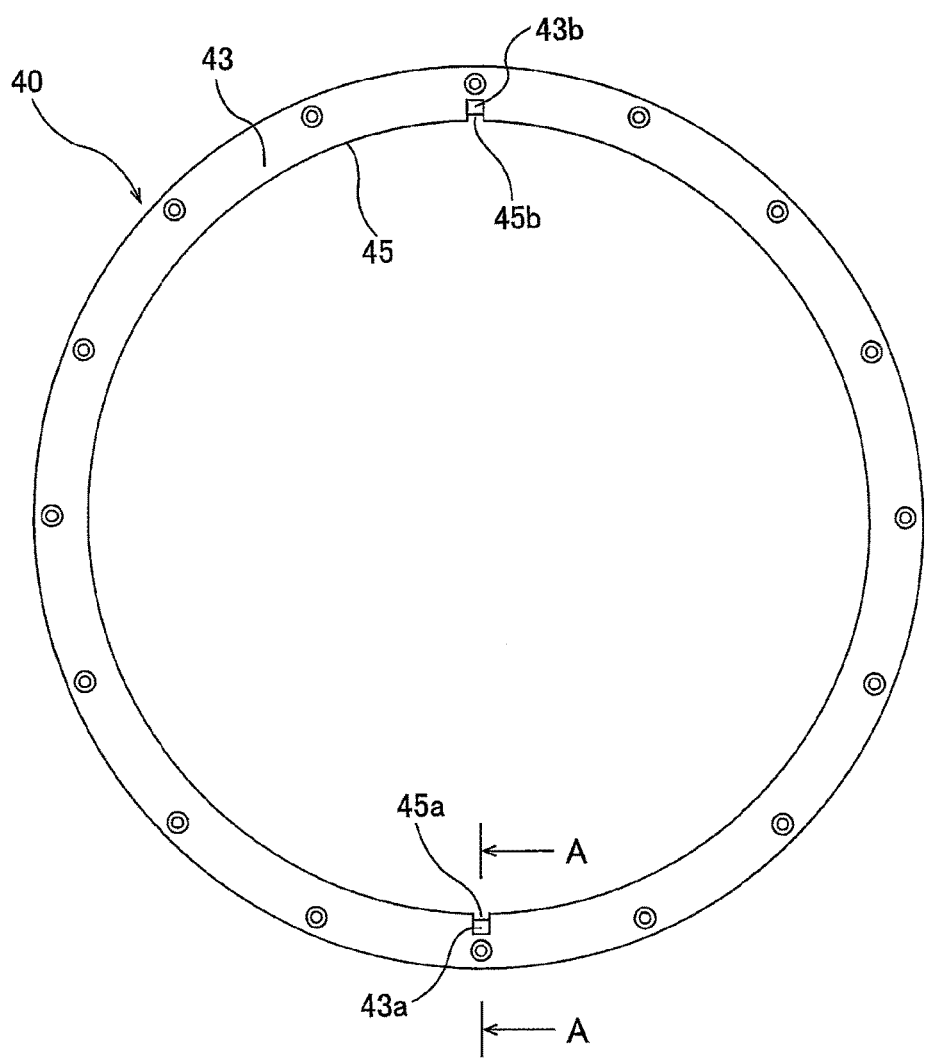
FIG. 11 is a view showing another embodiment of a fixing ring.
Figure 12:
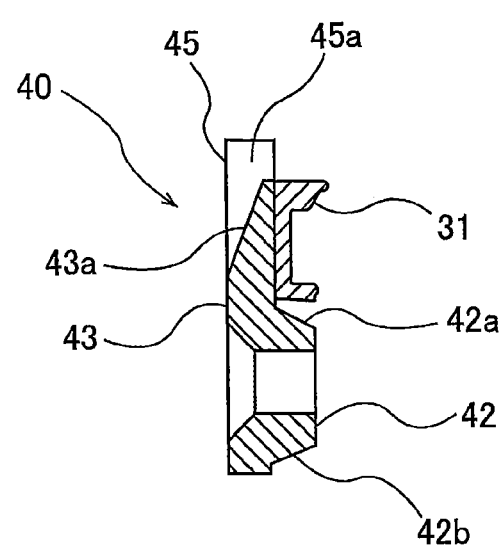
FIG. 12 is a cross-sectional view taken along line A-A in FIG. 11.

FIG. 11 is a view showing another embodiment of the fixing ring 40, and FIG. 12 is a cross-sectional view taken along line A-A in FIG. 11. In order to rapidly expel the plating solution existing between the regulation ring 45 and the wafer W when the substrate holder 7 in the vertical position is pulled out of the plating solution, the fixing ring 40 may preferably have a first cutout (or first recess) 45a and a second cutout (or second recess) 45b which serve as a liquid-relief passage and a vent passage.

The first cutout 45a and the second cutout 45b are formed in the regulation ring 45. The first cutout 45a and the second cutout 45b are symmetrical with respect to a center of the regulation ring 45 (i.e., a center of the fixing ring 40). When the substrate holder 7 is in the vertical position, the first cutout 45a is located at a lowest position of the fixing ring 40 (more specifically, at a lowest position of the regulation ring 45), while the second cutout 45b is located at a highest position of the fixing ring 40 (more specifically, at a highest position of the regulation ring 45). In order to accelerate expelling of the plating solution and introducing of the air, the seal-ring pressing portion 43 has a first tapered passage 43a and a second tapered passage 43b which are connected to the first cutout 45a and the second cutout 45b, respectively.

When the substrate holder 7 in the vertical position is pulled out of the plating solution, the plating solution held in a gap between the wafer W and the regulation ring 45 flows downwardly through the first cutout 45a (i.e., the liquid-relief passage), thus falling from the substrate holder 7, while the ambient air is introduced through the second cutout 45b (i.e., the vent passage) into the gap between the wafer W and the regulation ring 45, thereby assisting the plating solution in flowing downwardly. In this manner, since the plating solution flows downwardly through the first cutout 45a while the air is introduced through the second cutout 45b, the plating solution can be rapidly removed from the surface of the wafer W when the substrate holder 7 is pulled out of the plating solution. Only the first cutout 45a may be provided, while the second cutout 45b may be omitted.

Figure 13:
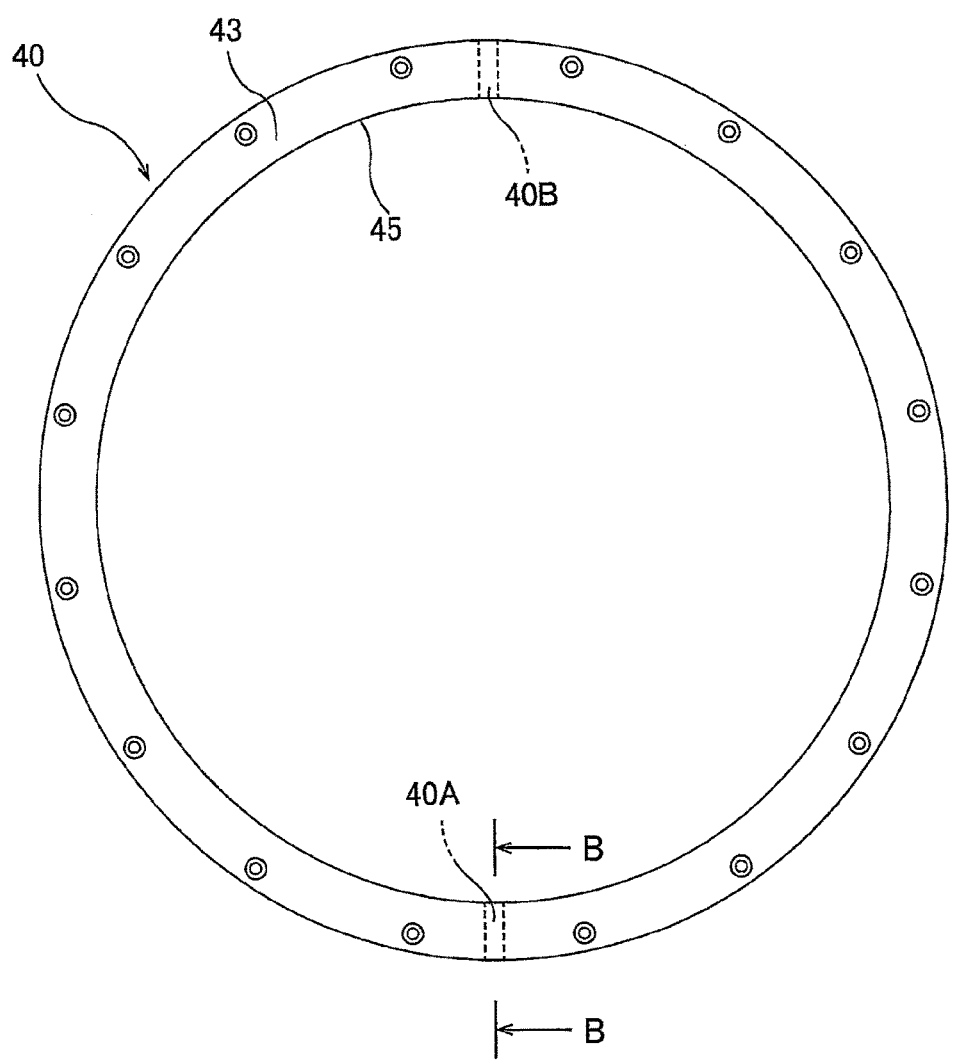
FIG. 13 is a view showing still another embodiment of the fixing ring.
Figure 14:
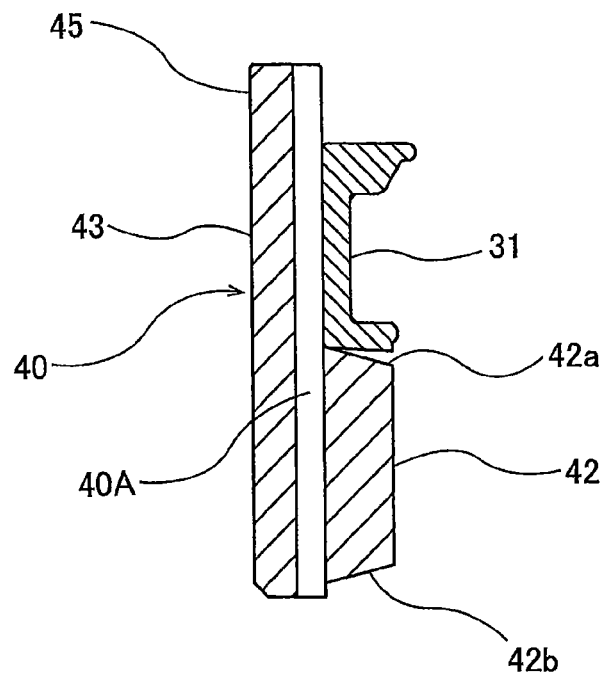
FIG. 14 is a cross-sectional view taken along line B-B in FIG. 13.
Figure 15:
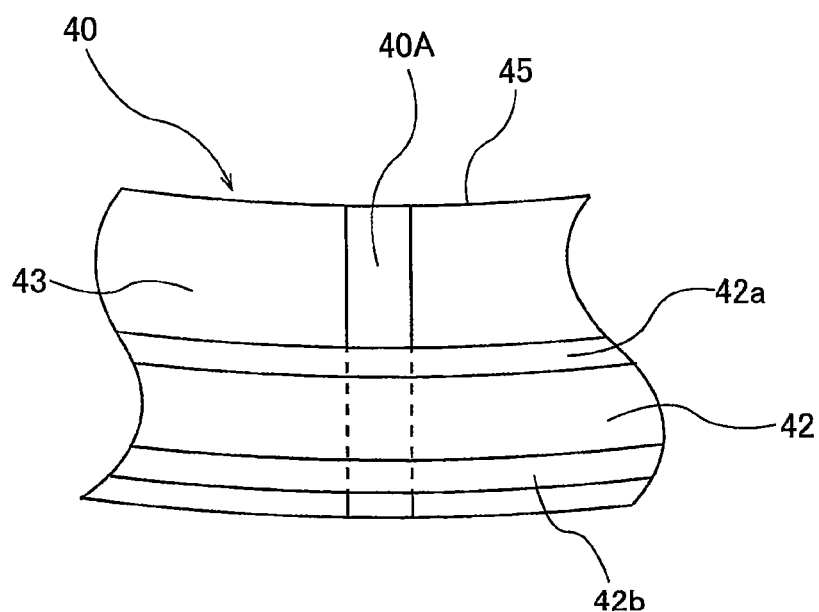
FIG. 15 is a rear view showing a part of the fixing ring shown in FIG. 13.

FIG. 13 is a view showing still another embodiment of the fixing ring 40, FIG. 14 is a cross-sectional view taken along line B-B in FIG. 13, and FIG. 15 is a rear view showing a part of the fixing ring 40 shown in FIG. 13. In order to rapidly expel the plating solution existing between the regulation ring 45 and the wafer W when the substrate holder 7 in the vertical position is pulled out of the plating solution, the fixing ring 40 may have a first through-hole 40A and a second through-hole 40B which serve as a liquid-relief passage and a vent passage, as shown in FIGS. 13 through 15.

The first through-hole 40A and the second through-hole 40B extend through the regulation ring 45, the seal-ring pressing portion 43, and the annular portion 42. The first through-hole 40A and the second through-hole 40B are symmetrical with respect to the center of the regulation ring 45 (i.e., the center of the fixing ring 40), and extend in the radial direction of the fixing ring 40. When the substrate holder 7 is in the vertical position, the first through-hole 40A is located at a lowest position of the fixing ring 40, while the second through-hole 40B is located at a highest position of the fixing ring 40.

When the substrate holder 7 in the vertical position is pulled out of the plating solution, the plating solution held in the gap between the wafer W and the regulation ring 45 flows downwardly through the first through-hole 40A (i.e., the liquid-relief passage), thus falling from the substrate holder 7, while the ambient air is introduced through the second through-hole 40B (i.e., the vent passage) into the gap between the wafer W and the regulation ring 45, thereby assisting the plating solution in flowing downwardly. In this manner, since the plating solution flows downwardly through the first through-hole 40A while the air is introduced through the second through-hole 40B, the plating solution can be rapidly removed from the surface of the wafer W when the substrate holder 7 is pulled out of the plating solution. Only the first through-hole 40A may be provided, while the second through-hole 40B may be omitted.

Figure 16:
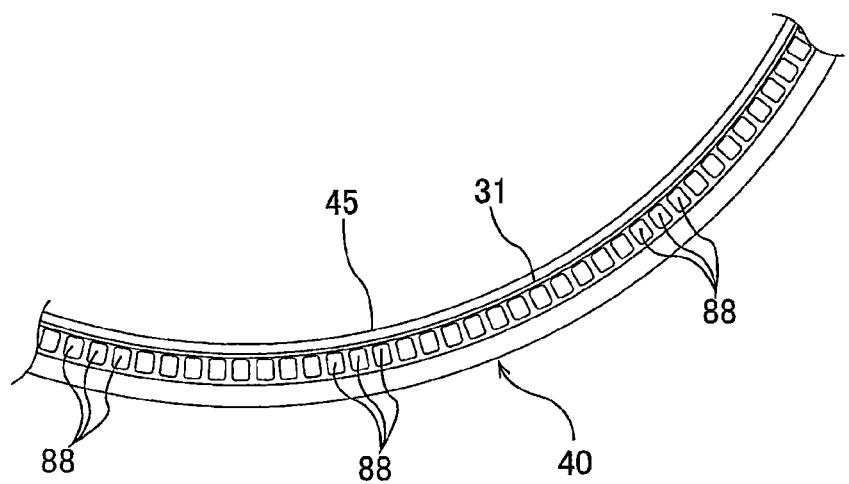
FIG. 16 is a rear view of the fixing ring.

FIG. 16 is a rear view of the fixing ring 40. As shown in FIG. 16, the electric contacts 88 are arranged at equal intervals along the circumferential direction of the seal ring 31. In this example, the inner circumferential edge of the regulation ring 45 is in a shape of circle.

Figure 17:
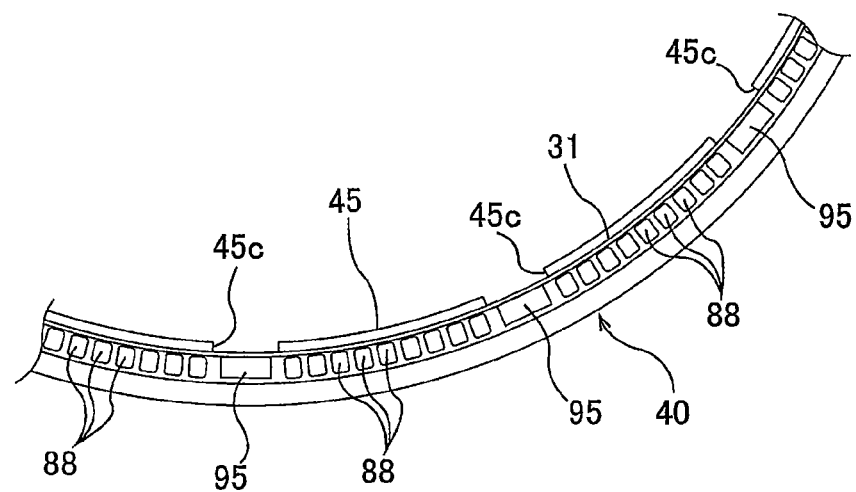
FIG. 17 is a rear view showing another structural example of the fixing ring.

FIG. 17 is a rear view showing another structural example of the fixing ring 40. In this example shown in FIG. 17, the electric contacts 88 are divided into several groups, and positioning members 95 are arranged between the respective neighboring groups. Each of the positioning members 95 comprises a leaf spring that can force an edge of the wafer W through the seal ring 31 toward the center of the wafer W to thereby perform positioning (or centering) of the wafer W. The positioning members 95 are arranged at equal intervals along the circumferential direction of the seal ring 31.

Since the positioning members 95 are located near the edge of the wafer W, the electric contacts 88 cannot be disposed at locations where the positioning members 95 are disposed. As a result, there exists a potential difference on the wafer W between the locations where the positioning members 95 are disposed and locations where the electric contacts 88 are disposed, resulting in a non-uniform deposition of a conductive material.

Figure 18:
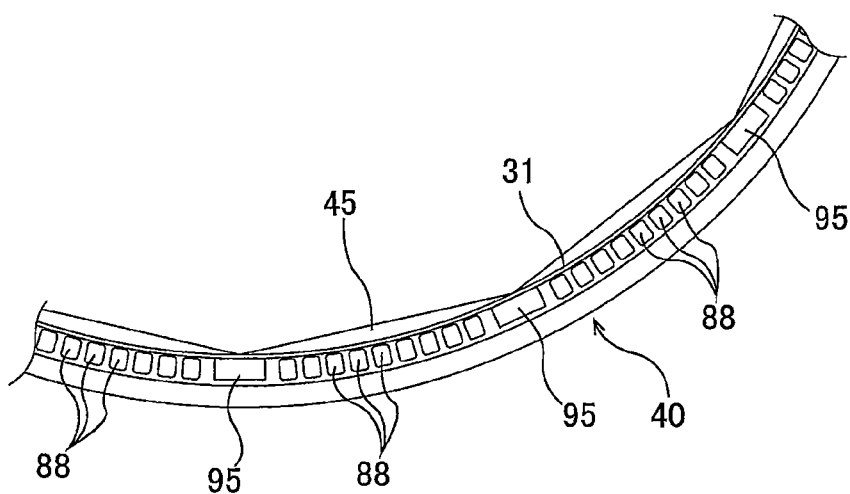
FIG. 18 is a rear view showing still another structural example of the fixing ring.

In order to prevent such a variation in the deposition of the conductive material along the circumferential direction of the wafer W, as shown in FIG. 17, the regulation ring 45 may have cutouts 45c at locations corresponding to the locations of the positioning members 95. Because the cutouts 45c do not regulate the electric field, it is possible to minimize a difference in an amount of the deposition of the conductive material between the locations where the positioning members 95 are disposed and the locations where the electric contacts 88 are disposed. Instead of the cutouts 45c, as shown in FIG. 18, the regulation ring 45 may have a polygonal inner edge such that a width of the regulation ring 45 is reduced at locations corresponding to the locations where the positioning members 95 are disposed. The width of the regulation ring 45 may be zero at locations corresponding to the locations where the positioning members 95 are disposed. The inner edge of the regulation ring 45, interconnecting neighboring two points, may be a linear line or a gently curved line.

In the examples shown in FIG. 17 and FIG. 18, a distance from the center of the regulation ring 45 to each of points on the inner edge of the regulation ring 45 varies. That is, the regulation ring 45 comprises a regulation ring which is asymmetric in azimuth. The regulation ring 45, which is asymmetric in azimuth, has an electric-field shielding area which is asymmetric in azimuth.

Figure 19:
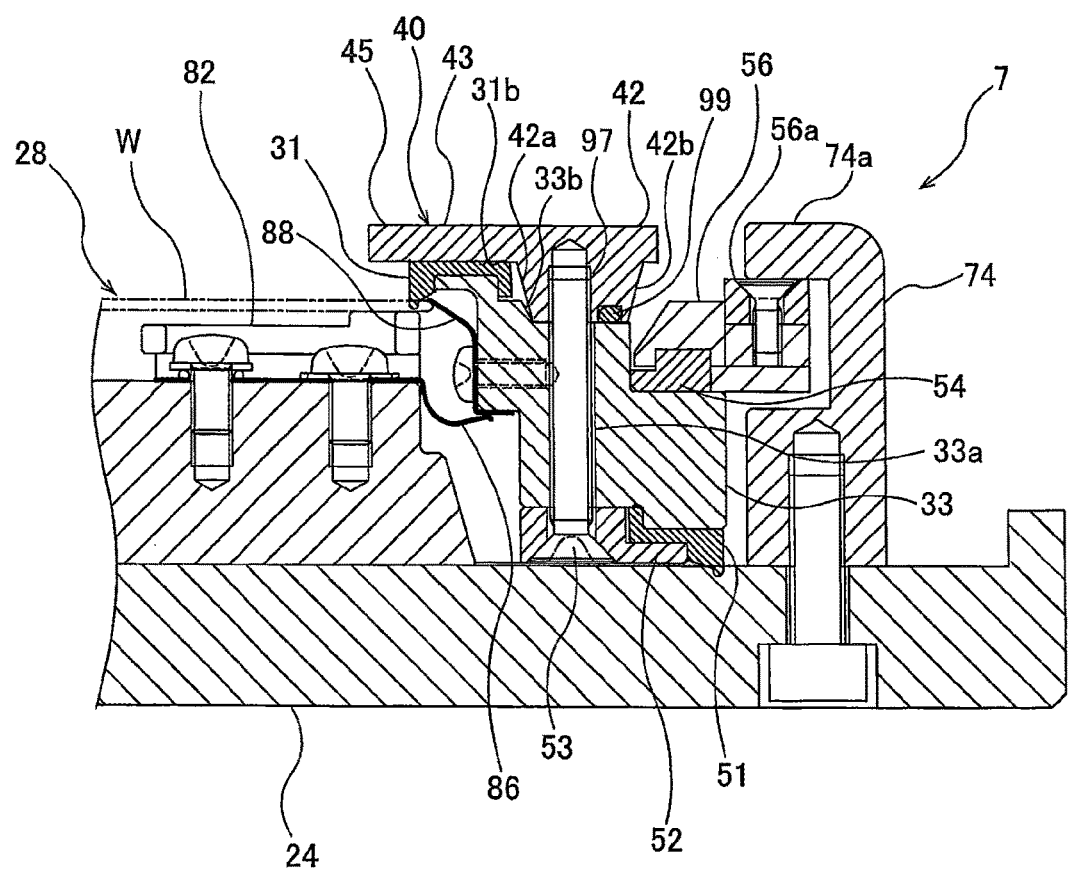
FIG. 19 is a cross-sectional view showing another embodiment of the substrate holder.

FIG. 19 is a cross-sectional view showing another embodiment of the substrate holder 7. Structures of this embodiment, which will not be described particularly, are the same as those of the above-discussed embodiment, and their repetitive descriptions are omitted. In this embodiment, the screws 41 (see FIG. 5) extending through the fixing ring 40 are not provided. The reason of this is as follows. Heads of the screws 41, which are exposed in the surface of the substrate holder 7 as shown in FIG. 5, form fine surface irregularities, thus reducing a cleaning performance on the substrate holder 7. In addition, the fixing ring 40 and the screws 41 are formed from titanium which is corrosion-resistant against the plating solution. When these titanium parts are brought into contact with the plating solution, the titanium parts may generate a by-product. When the substrate holder 7 is pulled out of the plating solution, the by-product, together with the plating solution, flows downwardly on the substrate holder 7 and may be attached to a plated surface of the wafer W, thus possibly causing a contamination of the wafer W.

Thus, in this embodiment, the first fixing ring 40 is secured to the support ring 33 by screws 53 which are also used to secure the second fixing ring 52 to the support ring 33. Specifically, both of the first fixing ring 40 and the second fixing ring 52 are secured to the support ring 33 by the common screws 53.

Through-holes 33a are formed in the support ring 33, and threaded holes 97 are formed in the fixing ring 40. The screws 53 extend through the through-holes 33a of the support ring 33 into the threaded holes 97 of the fixing ring 40. Distal ends of the screws 53 engage with the threaded holes 97, so that the fixing ring 40 is secured to the support ring 33. One ends of the threaded holes 97 are opening ends connected to the through-holes 33a of the support ring 33, respectively, and the other ends of the threaded holes 97 are closed. Therefore, the screws 53 are enclosed by the fixing ring 40 and the support ring 33 and are not exposed to the plating solution. Such an arrangement of the screws 53 can prevent the by-product from being generated due to the contact between the plating solution and the screws 53. Furthermore, the fixing ring 40 can have a flat surface, and a more improved cleaning performance on the substrate holder 7 can be achieved.

Further, in the embodiment shown in FIG. 19, at least a part of the surface, which can contact the plating solution, of the fixing ring 40 is coated with a resin material, such as PTFE. The resin material can prevent the by-product from being generated due to the contact between the plating solution and the fixing ring 40 which is made of titanium. In the previously-discussed embodiment shown in FIG. 5, the surface of the fixing ring 40 and the surfaces of the heads of the screws 41 may be coated with the resin material.

In this embodiment, the screw 53 extends through the fixing ring 52 and the support ring 33. If the plating solution enters the through-hole 33a of the support ring 33, the plating solution flows along the screw 53 until the plating solution may reach the conductive member 86 and the electric contact 88 disposed in the above-described hermetically-enclosed space, thus possibly causing the corrosion of the conductive member 86 and the electric contact 88.

Figure 20:
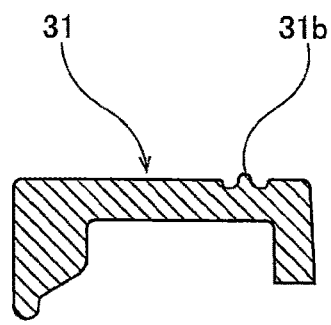
FIG. 20 is a cross-sectional view of a seal ring shown in FIG. 19.

Thus, in order to prevent the infiltration of the plating solution, the seal ring 31 has an inner annular protrusion 31b on a surface thereof which is in contact with the fixing ring 40. FIG. 20 is a cross-sectional view of the seal ring shown in FIG. 19. As shown in FIG. 20, the inner annular protrusion 31b projects from the surface of the seal ring 31. This inner annular protrusion 31b is constituted as a part of the seal ring 31, and is formed from an elastic material. When the screws 53, shown in FIG. 19, are fastened, the inner annular protrusion 31b of the seal ring 31 is pressed against the fixing ring 40, thereby completely sealing a gap between the seal ring 31 and the fixing ring 40. The screws 53 are located outside the inner annular protrusion 31b. Therefore, the plating solution that has entered radially outwardly toward the screws 53 is blocked by the inner annular protrusion 31b.

Further, in order to ensure the prevention of the infiltration of the plating solution, an annular seal 99, which is interposed between the support ring 33 and the fixing ring 40, is provided. This annular seal 99 is disposed in an annular groove formed in the annular portion 42 of the fixing ring 40. The seal ring 31 and the screws 53 are located inside the annular seal 99. This annular seal 99 serves to seal the gap between the support ring 33 and the fixing ring 40 to thereby prevent the infiltration of the plating solution.

Since the screws 53 are located outside the inner annular protrusion 31b and located inside the annular seal 99, the plating solution does not reach the screws 53.

As shown in FIG. 19, a surface of the support ring 33 which is in contact with the annular portion 42 of the fixing ring 40 includes an annular slope 33b. This annular slope 33b is inclined radially inwardly. As described above, the inner circumferential surface 42a of the annular portion 42 of the fixing ring 40 is constituted by the tapered surface. This inner circumferential surface 42a is in contact with the annular slope 33b, so that positioning (i.e., centering) of the fixing ring 40 with respect to the support ring 33 can be achieved.

As discussed above, the fixing ring 40 has the regulation ring 45 for regulating the electric field. In order to uniformly deposit the conductive material over the entire surface of the wafer W, centering of the regulation ring 45 is important. According to this embodiment, the contact between the inner circumferential surface (tapered surface) 42a of the annular portion 42 of the fixing ring 40 and the annular slope 33b of the support ring 33 can achieve the positioning of the fixing ring 40 with respect to the support ring 33, i.e., the centering of the regulation ring 45.

Figure 21:
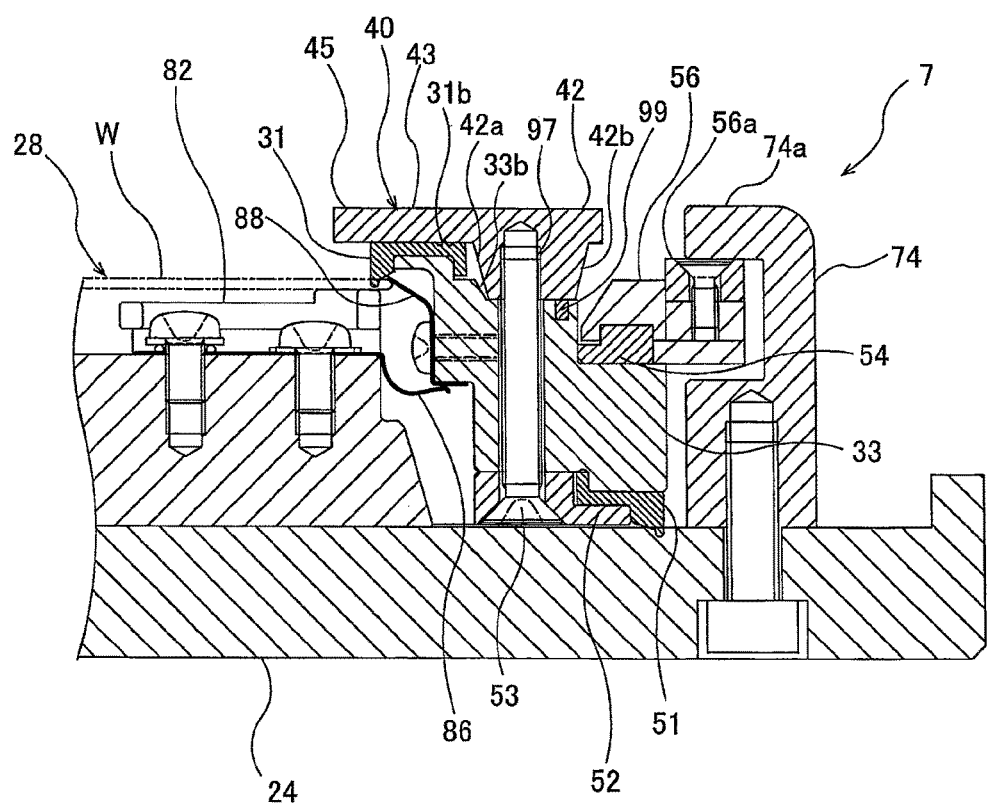
FIG. 21 is a cross-sectional view showing still another embodiment of the substrate holder.

FIG. 21 is a cross-sectional view showing still another embodiment of the substrate holder 7. Structures of this embodiment, which will not be described particularly, are the same as those of the above-discussed embodiment shown in FIG. 19, and their repetitive descriptions are omitted. This embodiment is the same as the embodiment shown in FIG. 19 in that the annular seal 99 is interposed between the support ring 33 and the fixing ring 40, but is different in that this annular seal 99 is disposed in an annular groove formed in the support ring 33. As with the embodiment shown in FIG. 19, the annular seal 99 seals the gap between the support ring 33 and the fixing ring 40 to thereby prevent the entry of the plating solution.

Figure 22:
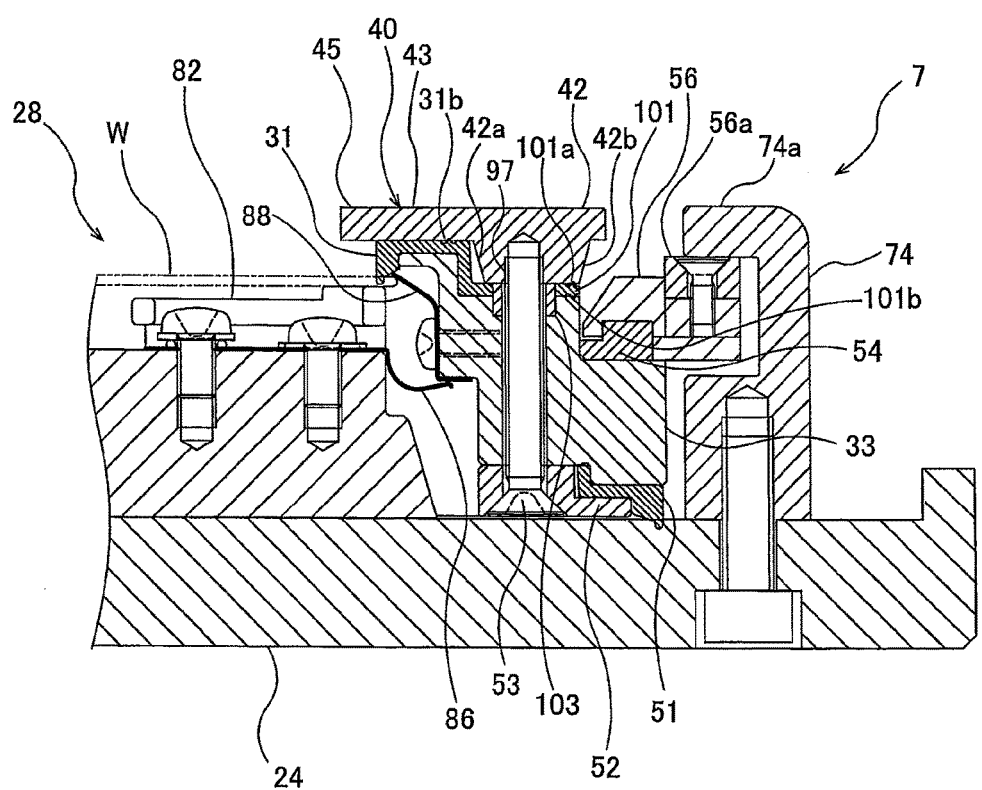
FIG. 22 is a cross-sectional view showing still another embodiment of the substrate holder.

FIG. 22 is a cross-sectional view showing still another embodiment of the substrate holder 7. Structures of this embodiment, which will not be described particularly, are the same as those of the above-discussed embodiment show in FIG. 19, and their repetitive descriptions are omitted. In this embodiment, the annular seal 99 is not provided. Instead, the seal ring 31 has a seal flange 101 which is interposed between the support ring 33 and the fixing ring 40. This seal flange 101 has the same function as that of the annular seal 99 in the above-described embodiments. The screws 53 extend through the seal flange 101.

Tube spacers 103 are disposed between the support ring 33 and the fixing ring 40. Each of the tube spacer 103 has a cylindrical shape. The screws 53 extend through the tube spacers 103, respectively. The tube spacers 103 serve to prevent the fixing ring 40 from excessively crushing the seal flange 101 which is made of an elastic material, when the screws 53 are fastened.

Figure 23:
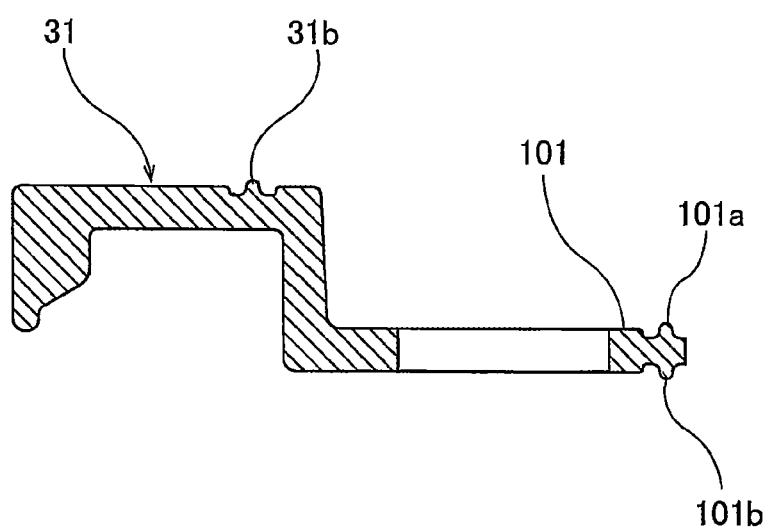
FIG. 23 is a cross-sectional view of a seal ring shown in FIG. 22.

FIG. 23 is a cross-sectional view of the seal ring 31 shown in FIG. 22. The seal flange 101 has a first outer annular protrusion 101a which is in contact with the fixing ring 40, and further has a second outer annular protrusion 101b which is in contact with the support ring 33. The screws 53 are located inside the first outer annular protrusion 101a and the second outer annular protrusion 101b. When the screws 53 are fastened, the first outer annular protrusion 101a are pressed by the fixing ring 40, thereby completely sealing a gap between the fixing ring 40 and the seal flange 101. Similarly, when the screws 53 are fastened, the second outer annular protrusion 101b are pressed by the support ring 33, thereby completely sealing a gap between the support ring 33 and the seal flange 101.

Further, as with the embodiment shown in FIG. 19, the seal ring 31 has the above-described inner annular protrusion 31b. Since the screws 53 are located outside the inner annular protrusion 31b and located inside the first outer annular protrusion 101a and the second outer annular protrusion 101b, the plating solution does not reach the screws 53.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:
1. A substrate holder comprising:
a base member comprising a support surface configured to support a substrate to be plated in a plating solution;
a seal ring configured to be brought into contact with a peripheral portion of the substrate such that the seal ring presses down upon the substrate thereby capturing the substrate between the seal ring and the support surface of the base member;
a support ring supporting the seal ring;
a fixing ring pressing the seal ring against the support ring, the fixing ring including an annular portion having an inner circumferential surface and an outer circumferential surface, each of which is constituted by a tapered surface, the outer circumferential surface being inclined downwardly toward an inside of the substrate holder when the substrate holder is in a vertical position; and wherein the fixing ring, the support ring, and the seal ring are pivotally coupled to the base member, wherein the outer circumferential surface defines a flow path for the plating solution to prevent the plating solution from flowing across the support surface of the base member and the substrate when the substrate is supported by the support surface and when the substrate holder is removed from the plating solution, wherein the fixing ring further including a seal-ring pressing portion connected to the annular portion, and a regulation ring projecting radially inwardly from the seal-ring pressing portion, the regulation ring having an inside diameter which is smaller than an inside diameter of the seal ring.

2. The substrate holder according to claim 1, further comprising:

a screw securing the fixing ring to the support ring, the screw extending through the support ring into a threaded hole formed in the fixing ring.

3. The substrate holder according to claim 2, wherein the seal ring has an inner annular protrusion which is in contact with the fixing ring, and the screw is located outside the inner annular protrusion.

4. The substrate holder according to claim 2, further comprising:

an annular seal held between the support ring and the fixing ring, the seal ring and the screw being located inside the annular seal.

5. The substrate holder according to claim 2, wherein the seal ring includes a seal flange held between the support ring and the fixing ring, and the screw extends through the seal flange.

6. The substrate holder according to claim 5, wherein the seal flange includes a first outer annular protrusion which is in contact with the fixing ring and a second outer annular protrusion which is in contact with the support ring, and the screw is located inside the first outer annular protrusion and the second outer annular protrusion.

7. The substrate holder according to claim 1, wherein the annular portion, the seal-ring pressing portion, and the regulation ring are formed integrally.

8. The substrate holder according to claim 1, wherein the fixing ring has a liquid-relief passage and a vent passage which are symmetrical with respect to a center of the fixing ring.

9. The substrate holder according to claim 8, wherein each of the liquid-relief passage and the vent passage comprises a cutout formed in the regulation ring.

10. The substrate holder according to claim 8, wherein each of the liquid-relief passage and the vent passage comprises a through-hole extending through the fixing ring in a radial direction.

11. The substrate holder according to claim 8, wherein the liquid-relief passage is located at a lowest position of the fixing ring and the vent passage is located at a highest position of the fixing ring when the substrate holder is in a vertical position.

12. The substrate holder according to claim 1, wherein the regulation ring is asymmetric in azimuth.

13. The substrate holder according to claim 1, wherein at least a part of the fixing ring is coated with a resin material.

14. The substrate holder according to claim 1, wherein the outer circumferential surface is inclined radially inwardly toward the supporting ring.

15. A plating apparatus comprising:

a plating bath capable of holding a plating solution therein;

a substrate holder configured to hold a substrate;

an anode disposed in the plating bath; and a power source capable of applying a voltage between the anode and the substrate held by the substrate holder, the substrate holder including a base member comprising a support surface configured to support the substrate;

a seal ring configured to be brought into contact with a peripheral portion of the substrate, a support ring supporting the seal ring, and a fixing ring pressing the seal ring against the support ring, the fixing ring including an annular portion having an inner circumferential surface and an outer circumferential surface, each of which is constituted by a tapered surface, the outer circumferential surface being inclined downwardly toward an inside of the substrate holder when the substrate holder is in a vertical position, the fixing ring further including a seal-ring pressing portion connected to the annular portion, and a regulation ring projecting radially inwardly from the seal-ring pressing portion, the regulation ring having an inside diameter which is smaller than an inside diameter of the seal ring, wherein the fixing ring, the support ring, and the seal ring are pivotally coupled to the base member, wherein the outer circumferential surface defines a flow path for the plating solution to prevent the plating solution from flowing across the support surface of the base member and the substrate when the substrate is supported by the support surface and when the substrate holder is removed from the plating solution.

16. The plating apparatus according to claim 15, further comprising:

a screw securing the fixing ring to the support ring, the screw extending through the support ring into a threaded hole formed in the fixing ring.

17. The plating apparatus according to claim 16, wherein the seal ring has an inner annular protrusion which is in contact with the fixing ring, and the screw is located outside the inner annular protrusion.

18. The plating apparatus according to claim 16, further comprising:

an annular seal held between the support ring and the fixing ring, the seal ring and the screw being located inside the annular seal.

19. The plating apparatus according to claim 16, wherein the seal ring includes a seal flange held between the support ring and the fixing ring, and the screw extends through the seal flange.

20. The plating apparatus according to claim 19, wherein the seal flange includes a first outer annular protrusion which is in contact with the fixing ring and a second outer annular protrusion which is in contact with the support ring, and the screw is located inside the first outer annular protrusion and the second outer annular protrusion.

21. The plating apparatus according to claim 15, wherein the annular portion, the seal-ring pressing portion, and the regulation ring are formed integrally.

22. The plating apparatus according to claim 15, wherein the fixing ring has a liquid-relief passage and a vent passage which are symmetrical with respect to a center of the fixing ring.

23. The plating apparatus according to claim 22, wherein each of the liquid-relief passage and the vent passage comprises a cutout formed in the regulation ring.

24. The plating apparatus according to claim 22, wherein each of the liquid-relief passage and the vent passage comprises a through-hole extending through the fixing ring in a radial direction.

25. The plating apparatus according to claim 22, wherein the liquid-relief passage is located at a lowest position of the fixing ring and the vent passage is located at a highest position of the fixing ring when the substrate holder is in a vertical position.

26. The plating apparatus according to claim 15, wherein the regulation ring is asymmetric in azimuth.

27. The plating apparatus according to claim 15, wherein at least a part of the fixing ring is coated with a resin material.

28. The plating apparatus according to claim 15, wherein the outer circumferential surface is inclined radially inwardly toward the supporting ring.

* * * * *